United States Patent
Priefert et al.

(10) Patent No.: US 6,693,327 B2
(45) Date of Patent: Feb. 17, 2004

(54) LATERAL SEMICONDUCTOR COMPONENT IN THIN-FILM SOI TECHNOLOGY

(75) Inventors: Dirk Priefert, Moers (DE); Ralf Rudolf, Duisburg (DE); Viktor Boguszewicz, Essen (DE); Frank Michalzik, Hamminkeln/Mehroog (DE); Rolf Buckhorst, Mülheim a.d. Ruhr (DE)

(73) Assignee: EUPEC Europaische Gesellschaft fur Leistungshalbleiter mbH, Warstein (DE)

( * ) Notice: Subject to any disclaimer, the term of this patent is extended or adjusted under 35 U.S.C. 154(b) by 0 days.

(21) Appl. No.: 10/074,605

(22) Filed: Feb. 12, 2002

(65) Prior Publication Data

US 2002/0121664 A1 Sep. 5, 2002

(30) Foreign Application Priority Data

Feb. 12, 2001 (DE) .......................................... 101 06 359

(51) Int. Cl.[7] .......................... H01L 27/01; H01L 27/12; H01L 31/0392

(52) U.S. Cl. ...................... 257/347; 257/367; 257/368; 257/490; 257/495

(58) Field of Search ............................... 257/343, 347, 257/490, 495, 367, 368

(56) References Cited

U.S. PATENT DOCUMENTS 5,677,562 A * 10/1997 Korwin-Pawlowski et al. ........................ 257/490

FOREIGN PATENT DOCUMENTS

DE        4441724        5/1996

* cited by examiner

*Primary Examiner*—Thien Tran
(74) *Attorney, Agent, or Firm*—Richard M. Goldberg

(57) ABSTRACT

A lateral semiconductor element (10) in thin-film SOI technology comprises an insulator layer (14) which rests on a substrate (12) and is buried under a thin silicon film (16), on top of which the source, or anode, contact (18) and the drain, or cathode, contact (22) are mounted. The anode contact (18) and the cathode contact (22) each lie over separate shield regions (28,30) within substrate (12), with the anode contact (18) being electrically connected with substrate (12).

15 Claims, 3 Drawing Sheets

LATERAL SEMICONDUCTOR COMPONENT IN THIN-FILM SOI TECHNOLOGY

BACKGROUND OF THE INVENTION

This invention relates to a lateral semiconductor element in thin-film SOI technology, with an insulating later which rests on a substrate and is buried underneath a thin silicon film, on top of which the source, or anode, contact and the drain, or cathode, contact are mounted.

Semiconductor elements of the type described above have been known of for a long time, and are used, above all, in low voltage applications, e.g. as CMOS circuits. As a general rule, most circuits were contrived for demanding operating conditions (high temperatures, high particle radiation or electromagnetic radiation). Now, however, this technology is also increasingly finding its way into microprocessors and driver circuits.

Furthermore, these components may be either transistors or diodes. In this case, either an anode and a cathode contact or a source, a drain and a gate contact are mounted on the silicon film. As the position of the anode coincides functionally with the source contact of a transistor, and, accordingly, the cathode coincides with the drain contact, these terms will be used below in synonymous fashion, without thereby implying that the invention is restricted to a specific component.

At high operating voltages, the problem is that the blocking capacity of the buried insulator is insufficient, and the so-called back gate effect occurs, which means that the substrate has a control effect from below on the channel region of the SOI transistor and its threshold voltage is displaced. This means that with prior art semiconductor elements, it is virtually impossible to produce a plurality of components with a high blocking capacity using thin-film SOI technology.

These negative effects can be minimised or cancelled by means of very thick oxide layers. This approach is not satisfactory, however, because, for voltage of the order of 600 V, it is impossible to produce the oxides with a thin silicon film at reasonable technological or financial cost. By way of an alternative, a buried p-n junction can be created in the substrate, which protects the entire circuit from any harmful voltages which may occur from the underside of the switch. A p-n junction of this type, which can be produced e.g. by implantation through the silicon film and the buried oxide, is also referred to as a shield. It extends underneath and across the entire structure on a fixed potential.

The shield, however, only protects the circuit from voltages acting on the circuit from outside. The blocking voltages made possible by this are still relatively low, because the voltage breakdown is determined by the silicon film and the buried insulator.

SUMMARY OF THE INVENTION

The task of this invention is therefore to create a lateral semiconductor element of the type described above, which allows high blocking voltages inside the component, but is technologically simple to produce and economically viable to manufacture.

According to the invention, this task is solved in that the source or anode contact and the drain or cathode contact of the component each lie over separate shield areas within the substrate, with the anode contact being electrically connected to the substrate.

Like the prior art lateral semiconductor components in thin-film SOI technology, in this case the contacts are also disposed on a thin silicon film underneath which the insulating layer is buried. According to the invention, however, the anode, or source, gate and the gate contact of a transistor and the cathode, or drain, contact lie on two different shield areas floating with respect to each other. This not only reduces the space-charge region in the thin silicon film and the buried oxide, but in the substrate as well.

By means of the electrical contact between the anode contact and the substrate, the space-charge region is transferred to the substrate and thus homogenised in the silicon film.

The advantage of this semiconductor component lies in the high blocking capacity of its structure. The back gate effect no longer occurs because the shield region is structured and connected with the anode of each individual component. This means that back gate voltage can no longer occur.

The blocking capacity of this component is almost exclusively determined by the deep p-n junctions, i.e. shield rings, which, with an appropriate edge structure, make virtually any blocking voltages possible. The latch-up risk associated with a purely p-n insulation is eliminated.

The invention also offers the advantage that a plurality of high voltage switches can be integrated on a chip without any need for special epitaxy layers, oxide thicknesses of the buried insulator, or specific silicon film thicknesses. This means that bridgable systems can be built up on a chip and practically any vertical transistor structure integrated. Each transistor may contain a dielectrically insulated logic part, so that it is possible to manufacture whole half-bridge and full-bridge drivers with a control element.

To further increase the voltage sustaining capability, the two shield regions of the anode and cathode contacts are preferably insulated from each other by a buried edge structure disposed in-between them.

In one preferred embodiment, a floating field ring structure is used. With such floating field rings, which are also referred to as field limiting rings (FLR), one is dealing with an edge structure principle in which a blocking p-n junction is protected by upstream field rings, i.e. trough-shaped p-n junctions. These rings are not terminated and adjust themselves to a potential between maximum and minimum voltage.

In further preferred embodiments, the buried edge structure can also be contrived as a VLE or a JTE structure. In the case of the VLE structure (variation of lateral doping), a blocking p-n junction is extended by a pn junction. The doping which this requires declines in the lateral direction, which gives rise to a structure with an increasingly lower penetration depth and doping. In the case of a JTE structure (junction termination extension), the p-n junction, which joins up in the lateral direction, has a deeper penetration depth than the blocking p-n junction. In certain circumstances, however, the simple p-n junction disposed between the cathode and the anode contact is sufficient.

The electrical connection of the anode contact with the substrate is preferably produced directly by a metallic contact. In another preferred embodiment, this connection is produced by means of an electric component.

In addition to the anode contact, the cathode contact or, in the case of a transistor, the drain contact, is preferably also electrically connected with the substrate. It is essential that the shield region over which the main part of the blocking voltage declines is connected. If the blocking p-n junction is sufficiently connected, and if the SOI component adjusts to the horizontal voltage gradient, it may be possible to dispense with further connection of the SOI component.

If, for example, the substrate is n-doped and the shield is p-doped, the arrangement may only be operated with positive cathode-anode voltages, with the highest potential having to lie on a substrate contact which is attached at the back, or in another appropriate manner. In this case, the cathode shield forms a channel stop which closes off the structure in the substrate and prevents any expansion of the space-charge beyond the limits of the structure. In this case the cathode shield must be of the same doping type as the substrate, but oppositely doped with respect to the anode shield. If, for example, the substrate is n-doped and the anode shield is p-doped, the channel stop must be n$^+$ doped.

The semiconductor component according to the invention is preferably a transistor, with the source and gate contacts on the one hand, and the drain contact on the other hand, lying over separate shield regions within the substrate.

In further preferred embodiments, the semiconductor component is a diode, a voltage-proof resistor or an IGBT, i.e. an insulated gate bipolar transistor.

In one semiconductor circuit with a transistor as the semiconductor component according to the invention, one is dealing with a level-shift transistor which is integrated in a driver circuit with a suitable vertical power component such as an IGBT, a DMOS or similar.

If the semiconductor component according to the invention is a diode, this can preferably be an SOI diode which, as a decoupling diode, e.g. for measuring current, is integrated in an evaluation circuit with a suitable vertical power component such as an IGBT, a DMOS or similar.

A plurality of transistors and diodes are preferably connected as semiconductor components according to the invention to form a bridge-driver circuit.

BRIEF DESCRIPTION OF THE DRAWINGS

An example of a preferred embodiment of the invention will now be described in more detail with reference to the enclosed drawing, in which.

DETAILED DESCRIPTION

Figure 1:
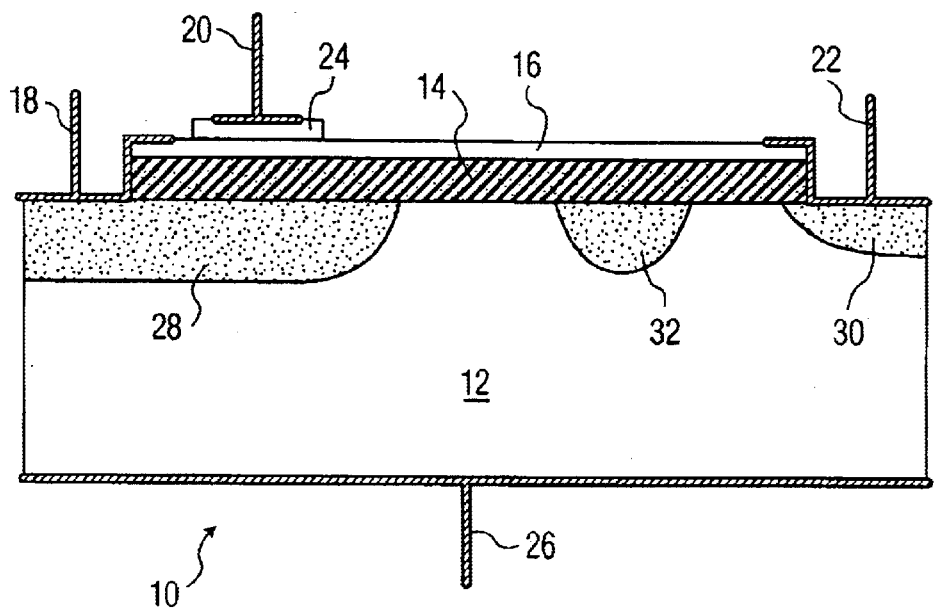
FIG. 1 shows a diagrammatic section through a lateral semiconductor component according to the invention.

The semiconductor component shown in FIG. 1 is a transistor 10, manufactured using thin-film SOI technology. Resting on a substrate 12, there is an insulating layer 14, on top of which there is a silicon film 16. The insulator 14 is therefore buried underneath the silicon film 16. On the top side of the transistor 10, there are metal contacts, namely the source contact 18, the gate contact 20, and the drain contact 22. The source contact 18 is mounted in such a manner that it is simultaneously connected to the silicon film 16 on the one hand, and to the surface of the substrate 12 on the other hand. In the same way, drain contact 22, which is mounted on an edge of the silicon film 16 opposite source contact 18, is simultaneously connected to silicon film 16 and substrate 12. Gate contact 20 is disposed on silicon film 16 in the vicinity of source contact 18, with there being a polysilicon layer 24 between metal contact 20 and the surface of the silicon film 16. Furthermore, on the underside of substrate 12 opposite the insulator 14 and silicon film 16, there is a rearward drain contact 26. Differing from the embodiment shown here, this drain contact 26 can also be disposed in another position on the top surface of substrate 12.

Inside the top surface portion of substrate 12, an anode shield 28, i.e. a buried p-n junction, is provided underneath source contact 18 and gate contact 20. A cathode shield 30 is provided in the same manner underneath drain contact 22. Between anode shield 28 and cathode shield 30 there is a floating field ring 32 as a buried edge structure.

The overall arrangement of the transistor 10 shown in FIG. 1 therefore corresponds to a prior art transistor in thin-film SO technology, which is disposed on an edge structure 28, 30, 32. Source contact 18 and gate contact 20 of transistor 10 are positioned directly above the anode zone 28 of the edge structure and are therefore shielded against interfering fields. In contrast, drain contact 22 is positioned on the cathode side 30 of the edge structure.

Contrary to the embodiment shown here, drain contact 22 need not necessarily be connected with substrate 12. It is essential, however, that the shield region above which the main part of the blocking voltage declines is connected. If the blocking p-n junction is sufficiently connected, and if the SOI component adjusts to the horizontal voltage gradient, further connecting of the SOI component may not be necessary. In this case, a high doping in the silicon film 16 of the opposite doping type to the shield-trough, can assume the characteristics of a channel stop.

If substrate 12 is n-doped, for example, and anode shield 28 is p-doped, the transistor arrangement 10 may only be operated with positive drain source voltages, with the highest potential having to be at rearward drain contact 26. If the dopings are the other way round, i.e. substrate 12 is p-doped and shield 28 is n-doped, only negative drain source voltages are allowed.

The voltage breakdown is achieved via the edge structure, which comprises floating field ring 32. Channel stop 30 prevents the space-charge from expanding beyond the limit of the structure and simultaneously protects drain contact 22 from interfering fields. Instead of floating field ring 32, it is also possible to use either a VLE structure or a JTE structure as the buried edge structure.

Instead of the illustrated transistor 10 of the invention, other semiconductor components such as e.g. diodes, voltage-proof resistors, IGBTs and more can also be made. In this case, the arrangement of the anode contact of the diodes coincides with the above-described arrangement of source contact 18, whilst the cathode contact coincides with drain contact 22.

It should also be pointed out that several components 10 according to the invention can be contrived on the same buried edge structure, connected in parallel. For example, circuits with a plurality of transistors, voltage-proof resistors, a diode network or a combination of such components. Connections in series are also possible, e.g. of transistors and diodes.

The electrical behaviour of the described transistor 10 as a discrete component can be described as follows: if a high positive voltage is applied to drain contacts 22,26 and source 18 and gate 20 are earthed, a space-charge region builds up between source 18 and drain 22. In contrast to completely insulated SOI components, however, this space-charge region is not only built up in silicon film 16, but also, by means of connection with substrate 12, underneath silicon film 16. This leads to a far more homogeneous space-charge region gradient than otherwise occurs in a relatively thin silicon film 16. Curvature of the space-charge region virtually never occurs.

The field lines underneath SOI layer 14,16, run in the same way as a conventional edge structure. The space-charge region is significantly influenced by field rings 32 underneath silicon film 16. The further the space-charge region in substrate 12 extends in the lateral direction, the further it also expands in silicon film 16. This allows a homogenous breakdown of the space-charge region in silicon film 16.

When the doping in the silicon film 16 is the same or less than that of the drift area, the static avalanche breakthrough always occurs in the substrate 12, thereby ensuring optimum blocking capacity for the transistor 10 according to the invention. The blocking capacity of the overall system then depends exclusively on the layer structure of substrate 12 and the arrangement and depth of field rings 32, or any other chosen edge structure.

Figure 2:
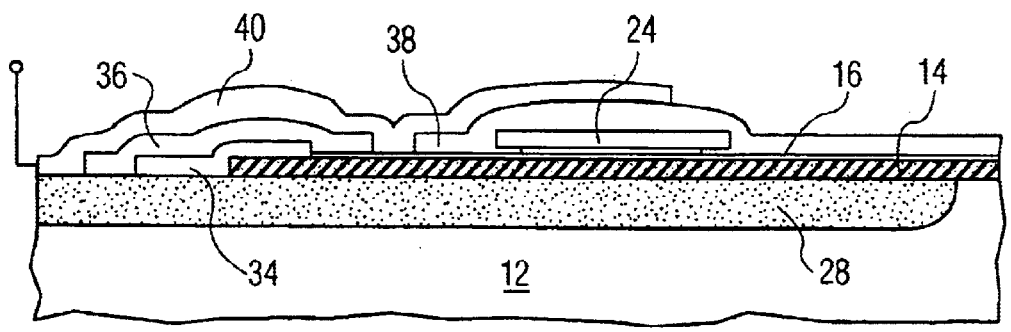
FIG. 2 shows a partial section of the anode section of a semiconductor component of FIG. 1 according to the invention.

FIG. 2 shows an enlarged view of the portion of a transistor 10 in which the anode shield 28 is located. On the surface of substrate 12, in whose edge portion anode shield 28 is disposed, the insulator 14 and the silicon layer 16 are layered on top of each other in the known manner. Source contact 18 is mounted on the left edge of insulating layer 14 in FIG. 2 in such a manner that a field oxide layer 34 rests against the edge of buried insulator 14 on the one hand, and the anode shield 28 on the other hand. The field oxide layer 34 is enclosed by an intermediate oxide layer 36. Gate contact 20, on the other hand, is in contact with the polysilicon layer 24 already described in FIG. 1, which, in a similar way to the field oxide layer 34, is covered by an intermediate oxide layer 38. A metal layer 40 is disposed on top of field oxide layers 36, 38.

Figure 3:
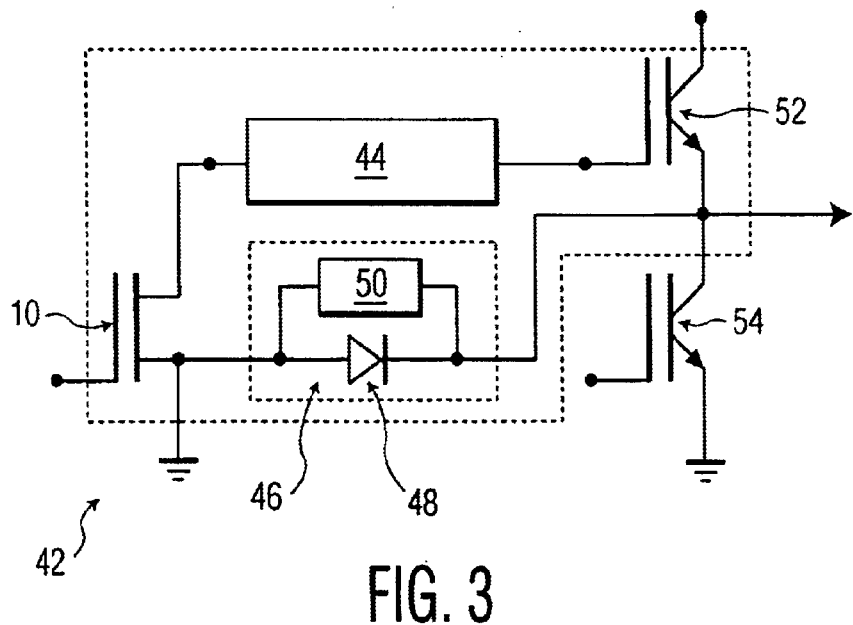
FIG. 3 is a circuit diagram of a circuit with a semiconductor component according to the invention as a transistor.

With reference to FIG. 3 it will now be explained how a transistor 10 according to the invention, can be integrated in a circuit. FIG. 3 shows the circuit diagram for a bridge circuit 42, in which transistor 10 is integrated as a level-shift transistor. Bridge circuit 42 also comprises a control unit 44 containing the driver, monitoring and sensor functions, which is only shown diagrammatically in FIG. 3. Control unit 44 is connected to the drain contact of transistor 10, whilst its source contact is earthed. With a monolithic integration, this gives rise to a parasitic structure, a so-called bypass 46, which can be approximately described by an equivalent circuit diagram with a diode 48 and a resistor 50 connected in parallel.

Control unit 44 is connected to the gate contact of an IGBT 52 as a high-side switch whose drain contact lies on the intermediate voltage $U_{ZW}$ and whose source contact is connected with the load. Also connected to the load are the opposite output of bypass 50 and the drain contact of another transistor 54 as a low-side switch whose source contact is earthed.

This invention allows the circuit module in FIG. 3 to be integrated on a chip in monolithic fashion. This results in enormous cost advantages and in space-saving. System stability is also increased at the same time, and there is less work involved in the assembly and connection technologies.

Furthermore, there are short signal transfer times, which, in turn, allow short reaction times, e.g. when the switch malfunctions.

The switching information for the power switch is transferred to control unit 44 by means of level control of transistor 10. To keep the shunt current in transistor 10 as low as possible, control unit 44 switches the IGBT 52 inversely to the high-voltage transistor. When the gate of transistor 10 is closed, the IGBT 52 switches on, thereby building up the whole intermediate circuit voltage $U_{ZW}$ via the high-voltage transistor.

Figure 4:
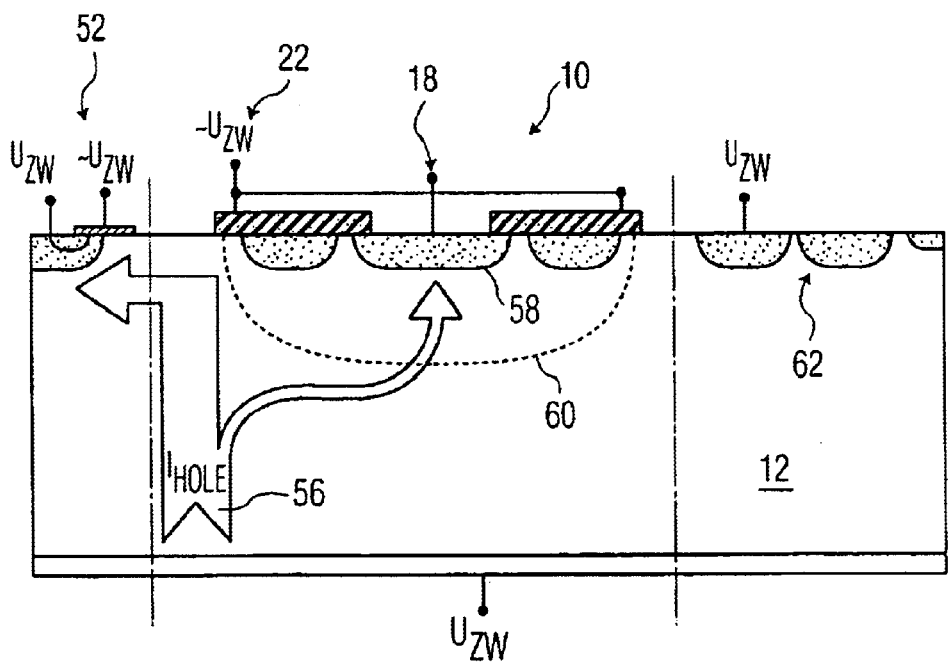
FIG. 4 is a diagrammatic representation of a bridge switch from the circuit in FIG. 3.

The static behaviour of transistor 10 when the IGBT 52 is in conducting mode will now be explained with reference to FIG. 4. When switched on, the drift length of the IGBT 52 is enriched with charge carriers. This charge carrier plasma arises as a result of the electron flow flowing in the IGBT channel and the hole current 56 caused by this, which arises through injection at the rearward p-n junction. As hole current 56 is influenced neither by the channel nor the blocking p-n junction, but by the potential gradient in the IGBT 52, there is a flow of current, a so-called parasitic bypass current, which also enters the p-trough 58 and hence the source 18 of transistor 10. This makes itself felt as increased leakage current at the source contact of transistor 10, but not at its drain contact 22. At the bypass diode 48 connecting both electrodes, the full intermediate circuit voltage $U_{ZW}$ applies. The total parasitic current in transistor 10 therefore comprises the SOI blocking current, the blocking current of the bypass diode 48 and the drawn off hole current 56 coming from the rear side.

To keep this current as small as possible, transistor 10 should be disposed as far as possible from the active zone of the IGBT 52. This increases the resistance, the SOI bypass resistance, that has to be overcome for hole current 56. Coupling hole current 56 to the electrode current also results in a lower bypass hole current.

If the IGBT 52 is replaced by a power MOS transistor, the lack of rearside injection means that no hole current can be generated. This excludes any parasitic bypass current.

Figure 5:
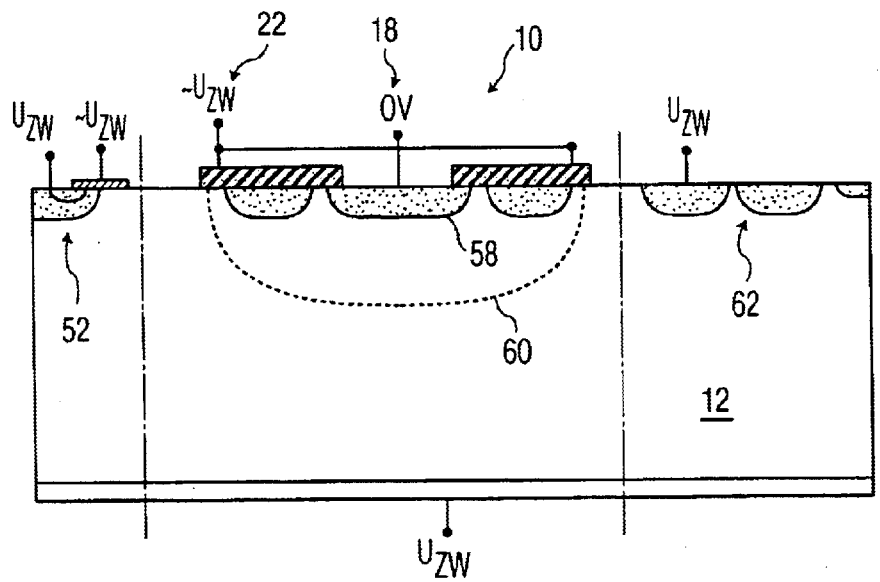
FIG. 5 is a view of the bridge switch of FIG. 4 in a different switching mode.

The blocking case will now be described with reference to FIG. 5. The drain contact and the source contact of the IGBT 52, and the drain contact of the transistor 10 according to the invention lie here on a high positive potential corresponding to the intermediate circuit voltage $U_{ZW}$. This means that the voltage breakdown occurs laterally and vertically only in transistor 10. This condition represents the critical load case for the high-voltage transistor. The space-charge region only spreads inside silicon film 16 and in substrate 12 in the transistor 10 area.

In the bridge circuit in FIG. 3, this case only applies to the top switch when both switches are currentless, the bottom switch absorbs the intermediate circuit voltage $U_{ZW}$, and the commutating current flows off through the free-wheeling diode of the top switch.

Figure 6:
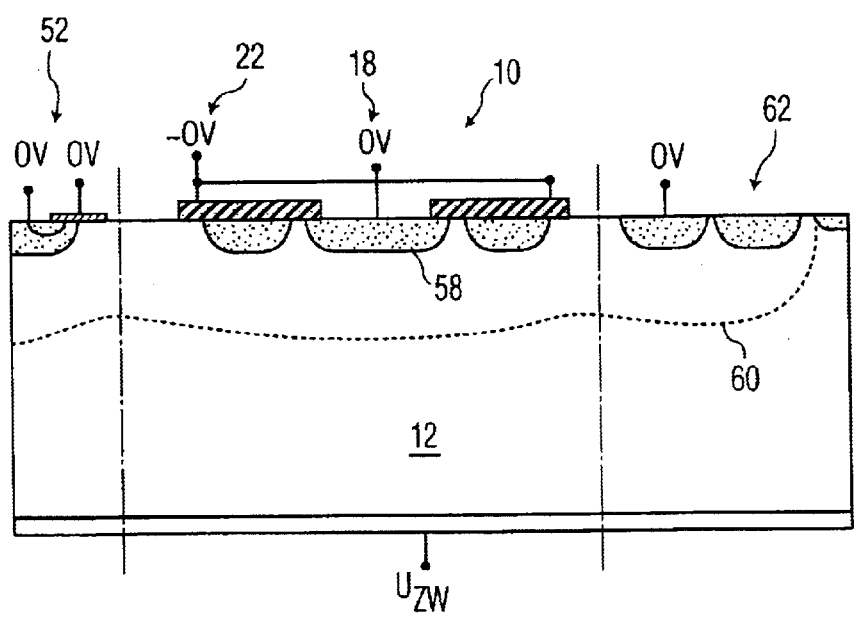
FIG. 6 shows the bridge switch of FIGS. 4 and 5 in the inhibiting mode.

Finally, FIG. 6 shows the blocking case in which the drain contact of the IGBT 52 lies on a high potential corresponding to intermediate circuit voltage $U_{ZW}$, whilst the other electrodes are earthed.

The breakdown of space-charge region 60 occurs vertically throughout the whole chip in all areas. The only place where there is any breakdown of the space-charge region 60 in the lateral direction as well is along the outer edge structure 62. In the bridge circuit shown in FIG. 3, this case applies to the top switch when the bottom switch is switched on. When this happens, the intermediate circuit voltage $U_{ZW}$ is absorbed by the top switch.

What is claimed is:

1. A lateral semiconductor component in thin-film SOI technology, comprising:

a substrate, an insulating layer which rests on the substrate, a thin film of doped, non-insulating silicon, said thin silicon film being layered directly on top of the insulating layer, separate shield regions within the substrate, a source/anode contact mounted on top of the insulating layer, the source/anode contact lying over one of the shield regions and electrically connected with the substrate, and a drain/cathode contact mounted on top of the insulating layer, the drain/cathode contact lying over another one of the shield regions.

2. The lateral semiconductor component of claim 1, wherein an electrical connection of the source/anode contact with the substrate is formed by an electric component.

3. The lateral semiconductor component of claim 1, wherein the drain/cathode contact is electrically connected with the substrate.

4. The lateral semiconductor component of claim 1, wherein the semiconductor component is a voltage-proof resistor.

5. The lateral semiconductor component of claim 1, wherein the semiconductor component is an IGBT.

6. The lateral semiconductor component of claim 1, wherein an electrical connection of the source/anode contact with the substrate is formed by a metallic contact.

7. The lateral semiconductor component according to claim 6, wherein a number of transistors and diodes are connected together to form a bridge driver circuit.

8. The lateral semiconductor component of claim 1, wherein the semiconductor component is a transistor.

9. The lateral semiconductor component according to claim 8, wherein the semiconductor component is a level-shift transistor and is integrated in a driver circuit with a vertical power component.

10. The lateral semiconductor component of claim 1, wherein the semiconductor component is a diode.

11. The lateral semiconductor component according to claim 10, wherein the semiconductor component is an SOI diode and is integrated as a decoupling diode in an evaluation circuit with a vertical power element.

12. The lateral semiconductor component of claim 1, wherein the shield regions of the source/anode and drain/cathode contacts are insulated from each other by a buried edge structure disposed in-between them.

13. The lateral semiconductor component of claim 12, wherein the buried edge structure is formed by a floating field ring structure.

14. The lateral semiconductor component of claim 12, wherein the buried edge structure is formed by a VLD structure.

15. The lateral semiconductor component of claim 12, wherein the buried edge structure is formed by JTE structure.

* * * * *